(12) United States Patent
Schumacher et al.

(10) Patent No.: US 11,849,308 B2
(45) Date of Patent: Dec. 19, 2023

(54) CIRCUIT FOR PROCESSING A WAKE-UP SIGNAL

(71) Applicant: Robert Bosch GmbH, Stuttgart (DE)

(72) Inventors: Hartmut Schumacher, Freiberg (DE); Eugen Wang, Illingen (DE); Leonardo Kovacic, Vaihingen Enz (DE)

(73) Assignee: ROBERT BOSCH GMBH, Stuttgart (DE)

( * ) Notice: Subject to any disclaimer, the term of this patent is extended or adjusted under 35 U.S.C. 154(b) by 497 days.

(21) Appl. No.: 17/260,830

(22) PCT Filed: Oct. 24, 2019

(86) PCT No.: PCT/EP2019/079069
§ 371 (c)(1),
(2) Date: Jan. 15, 2021

(87) PCT Pub. No.: WO2020/084074
PCT Pub. Date: Apr. 30, 2020

(65) Prior Publication Data
US 2021/0297953 A1 Sep. 23, 2021

(30) Foreign Application Priority Data
Oct. 24, 2018 (DE) .......................... 102018218171.3

(51) Int. Cl.
*H04W 52/02* (2009.01)
*G01R 19/165* (2006.01)
*F02D 41/02* (2006.01)

(52) U.S. Cl.
CPC ........ *H04W 52/0229* (2013.01); *F02D 41/02* (2013.01); *G01R 19/16576* (2013.01); *H04W 52/028* (2013.01); *Y02D 30/50* (2020.08)

(58) Field of Classification Search
CPC . H04W 52/0229; H04W 52/028; F02D 41/02; G01R 19/16576; Y02D 30/50
See application file for complete search history.

(56) References Cited

U.S. PATENT DOCUMENTS 8,682,242 B2 * 3/2014 Lee ................... H04W 52/0229
455/7
9,565,633 B2 2/2017 Samardzija et al.
(Continued)

FOREIGN PATENT DOCUMENTS

CN 101527467 A 9/2009
EP 1815448 A1 8/2007
(Continued)

OTHER PUBLICATIONS

International Search Report for PCT/EP2019/079069, dated Dec. 4, 2019.

*Primary Examiner* — Carlos Amaya
(74) *Attorney, Agent, or Firm* — NORTON ROSE FULBRIGHT US LLP; Gerard Messina

(57) ABSTRACT

A circuit for processing a wake-up signal, which is usable for activating electrical devices. The circuit includes an evaluation circuit, which checks an applied wake-up signal for its validity, and an output driver circuit, which outputs a processed wake-up signal when the evaluation circuit evaluates the applied wake-up signal as valid. The evaluation circuit has a comparator, which compares the applied wake-up signal to at least one threshold value for the evaluation. The evaluation circuit includes an input circuit and a switchable constant voltage source via which at least one criterion for evaluating the applied wake-up signal is adjustable in each case. The comparator is a multi-channel, integrated comparator circuit, and the individual channels of the inte- (Continued)

grated comparator circuit evaluating one criterion of an applied wake-up signal in each case.

10 Claims, 2 Drawing Sheets

(56) References Cited

U.S. PATENT DOCUMENTS

| | | |
|---|---|---|
| 2007/0159235 A1 | 7/2007 | Fukui et al. |
| 2011/0317601 A1 | 12/2011 | Bekritsky et al. |
| 2014/0062668 A1 | 3/2014 | Gudan et al. |

FOREIGN PATENT DOCUMENTS

| | | |
|---|---|---|
| WO | 2005057388 A1 | 6/2005 |
| WO | 2015180937 A1 | 12/2015 |
| WO | 2017083831 A1 | 5/2017 |

\* cited by examiner

CIRCUIT FOR PROCESSING A WAKE-UP SIGNAL

FIELD

The present invention relates to a circuit for processing a wake-up signal.

BACKGROUND INFORMATION

Conventional circuits for processing what is known as a wake-up signal normally are developed as a component of an application-specific integrated circuit (ASIC) or as discrete circuits. The latter can be subdivided into analog and digital approaches. The task of such a circuit for processing a wake-up signal is to check the signals at the input of the circuit for validity, the signals being used for activating or waking electrical devices such as control units. Only signals having a certain amplitude or time duration, for instance, are detected as valid. This means that a corresponding wake-up request or a correspondingly processed wake-up signal will be output to the downstream electrical devices only if the wake-up signal is valid. Thus, if the applied wake-up signal is not detected as valid, then the electrical devices will not be activated.

The conventional circuits for processing a wake-up signal have fixedly set and invariable parameters for the specified criteria for checking the applied wake-up signal. In addition, these circuits are unable to be switched off or deactivated or require additional protective elements in order to be directly connectable to wake-up lines in a vehicle. Moreover, these circuits typically include a comparator which activates or wakes the downstream electrical devices when a certain threshold is exceeded.

SUMMARY

A circuit for processing a wake-up signal in accordance with an example embodiment of the present invention may have the advantage that through the use of a multi-channel, integrated comparator circuit, a discrete input circuit and a switchable discrete constant voltage source, input parameters of the circuit, e.g., an input impedance, and criteria for evaluating the applied wake-up signal are easily able to be adjusted by varying the component values in the input circuit and/or in the constant voltage source. Moreover, these input parameters and criteria for use in motor vehicles are able to be specified very precisely and in a stable manner across a wide voltage and temperature range. This is made possible by the high input resistance of the multi-channel integrated comparator circuit by which a high-resistance decoupling of the line of the wake-up signal from the rest of the circuit is achievable. A very broad spectrum of customer specifications is able to be covered in this way without having to revise the layout of the circuit. In addition, the voltage supply of the constant voltage source can be connected only if a wake-up signal is actually applied. Embodiments of the circuit for processing a wake-up signal according to the present invention are therefore completely inactive in the no-load state except for the multi-channel, integrated comparator circuit and are thus characterized by a very low current consumption suitable for permanently supplied systems. The use of the multi-channel, integrated comparator circuit allows for a relatively compact design of the circuit because only a few external components are necessary. The use of a permanently active and controlled voltage supply and a clock source is therefore not required.

Embodiments of the present invention provide a circuit for processing a wake-up signal, which is usable for the activation of electrical devices. The circuit for processing a wake-up signal includes an evaluation circuit, which checks an applied wake-up call for its validity, and an output driver circuit, which outputs a processed wake-up signal when the evaluation circuit evaluates the applied wake-up signal as valid. The evaluation circuit includes a comparator, which compares the applied wake-up signal to at least one threshold value for the evaluation. The evaluation circuit includes an input circuit and a switchable constant voltage source via which at least one criterion for evaluating the applied wake-up signal is adjustable in each case, the comparator being realized as a multi-channel, integrated comparator circuit, and the individual channels of the integrated comparator circuit evaluating one criterion of the applied wake-up signal in each case.

Advantageous improvements of the example circuit for processing a wake-up signal are possible as a result of the measures and further developments described herein.

It is particularly advantageous that the input circuit specifies a first criterion for evaluating an amplitude of the applied wake-up signal via an adjustable division ratio of a potential divider. In addition, the input circuit may specify an input impedance of the evaluation circuit. With the aid of the potential divider, the wake-up signal is first divided down and rid of rapid transient disturbance signals with the aid of an additional filter capacitor. Via the adjustable division ratio of the potential divider, an amplitude detection threshold is able to be set as a first criterion. The amplitude detection threshold is easily adaptable to corresponding customer specifications by modifying the division ratio. A suitable selection of the internal resistance of the input circuit, which results from the values of the resistances of the potential divider, together with the capacitance value of the filter capacitor make it possible to remove transient disturbances which impede a stable amplitude detection.

In one advantageous refinement of the circuit in accordance with the present invention, the switchable constant voltage source is able to specify a second criterion for evaluating a time period of the applied wake-up signal via an adjustable time constant of an RC circuit. Moreover, the applied wake-up signal is able to activate the constant voltage source. The time constant of the RC circuit as a second criterion is easily adaptable to corresponding customer specifications by modifying the value of a charging resistance and/or of at least one capacitor of the RC circuit. In order to ensure an independence of the second criterion from the voltage supply of the circuit, a charging voltage of the at least one capacitor of the RC circuit is able to be stabilized to a predefined value of, for instance, 2.7 V, e.g., with the aid of a Zener diode. To prevent a permanent current consumption of the constant voltage source, it is connected, for example via a transistor, only if a wake-up signal is actually applied at the input of the evaluation circuit. This allows for a reduction of the no-load current consumption of the circuit to a few microampere because the energy for charging the at least one capacitor is withdrawn from the energy source of the vehicle only if a valid wake-up signal is present. In this way, the largest possible decoupling of the wake-up signal is attainable, which enables a constant and supply-independent impedance of the input of the circuit. Embodiments of the circuit according to the present invention are therefore suitable for sleep systems which are connected to a permanent supply and have to satisfy current demands of less than 100 μA in the sleep mode, i.e. in the non-active state.

In a further advantageous embodiment of the circuit in accordance with the present invention, the multi-channel, integrated comparator circuit may include an internal voltage source, which is able to generate a reference voltage. In addition, a first voltage signal, which is applied at the input of a first channel of the multi-channel, integrated comparator circuit and represents the amplitude of the applied wake-up signal, may be compared to the reference voltage, the first criterion being satisfied if the first voltage signal is greater than the reference voltage. The down-divided wake-up signal may be applied at the non-inverting input of the first channel, and the internal reference voltage may be applied at an internal inverting input of the first channel which preferably is not accessible from the outside in order to reduce the number of connection pins at the integrated comparator circuit. In addition, a second voltage signal, which is applied at the input of the second channel of the multi-channel, integrated comparator circuit and represents the time period of the applied wake-up signal, is able to be compared to the reference voltage, the second criterion being satisfied if the second voltage signal is greater than the reference voltage. In the process, the output signal of the constant voltage source applied across the at least one capacitor of the RC circuit may be applied as the second voltage signal at the inverting input of the second channel, and the internal reference voltage may be applied at an internal, non-inverting input of the second channel which preferably is not accessible from the outside in order to reduce the number of connection pins at the integrated comparator circuit.

In a further advantageous embodiment of the circuit in accordance with the present invention, the multi-channel, integrated comparator circuit is able to change a state at the output of the first channel when the first criterion is satisfied, the state change at the output of the first channel being able to start the evaluation of the second criterion. For example, the output of the first channel may change its active "low" state to a "high impedance" state. This is able to be implemented by what is known as an open collector output of the comparator, for instance. Through the state change of the output of the first channel, the at least one capacitor is able to be charged with the charging voltage via the charging resistor.

In a further advantageous embodiment of the circuit in accordance with the present invention, the multi-channel, integrated comparator circuit is able to change a state at the output of the second channel when the second criterion is satisfied, the state change at the output of the second channel being able to activate the output driver circuit. For example, the output of the second channel is able to change its "high impedance" state to an active "low" state. Since an open collector output is used in this instance as well, the output of the second channel is pulled to mass potential. Because of this state change of the output of the second channel, the output driver circuit is activated so that it outputs the processed wake-up signal, which activates or wakes downstream electrical devices.

An exemplary embodiment of the present invention is shown in the figures and will be described in greater detail in the following description. In the figures, identical reference numerals denote components or elements that execute the same or analogous functions.

DETAILED DESCRIPTION OF EXAMPLE EMBODIMENTS

Figure 1:
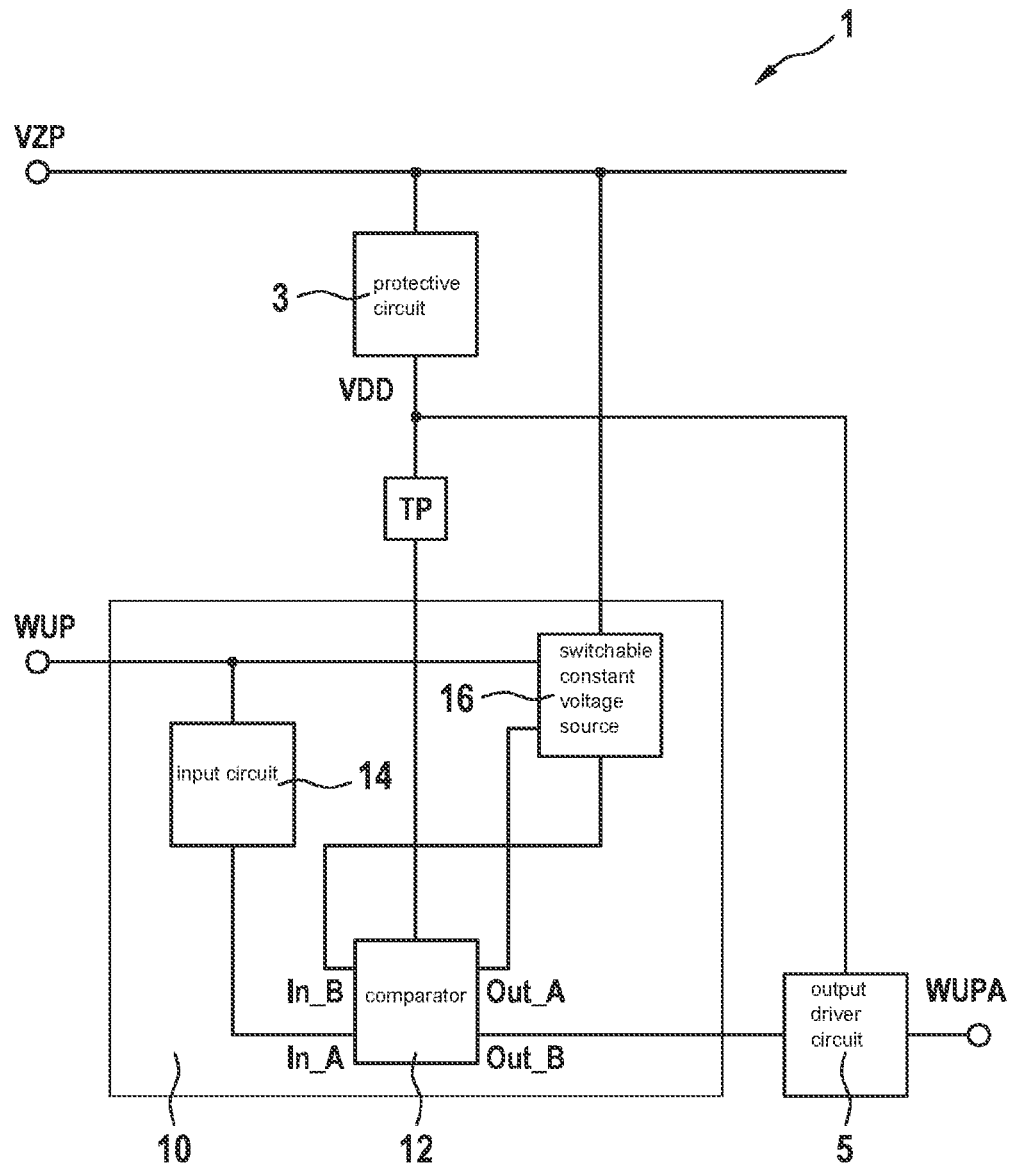
FIG. 1 shows a schematic block diagram of an exemplary embodiment of a circuit for processing a wake-up signal according to the present invention.
Figure 2:
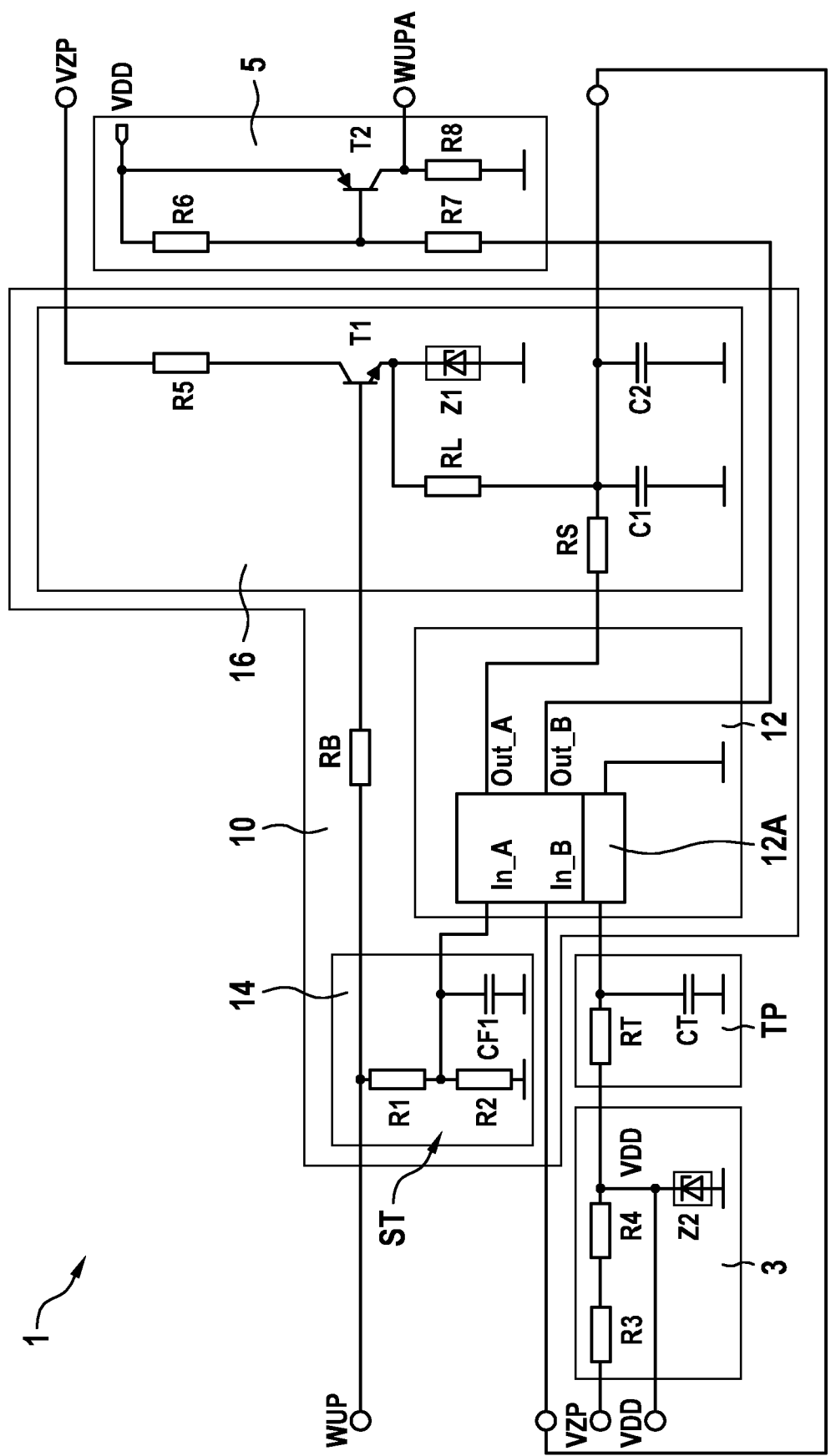
FIG. 2 shows a circuit diagram of the circuit for processing a wake-up signal according to the present invention from FIG. 1.

As is shown in FIGS. 1 and 2, the illustrated exemplary embodiment of a circuit 1 according to the present invention for processing a wake-up signal WUP, which is usable for the activation of electrical devices, includes an evaluation circuit 10 which checks an applied wake-up signal WUP for its validity; and an output driver circuit 5, which outputs a processed wake-up signal WUPA when evaluation circuit 10 evaluates an applied wake-up signal WUP as valid. Evaluation circuit 10 includes a comparator 12, which compares applied wake-up signal WUP to at least one threshold value for the evaluation. Evaluation circuit 10 includes an input circuit 14 and a switchable constant voltage source 16 via which at least one criterion is adjustable for the evaluation of applied wake-up signal WUP. In addition, comparator 12 is developed as a multi-channel, integrated comparator circuit 12A, the individual channels of integrated comparator circuit 12A evaluating one criterion of applied wake-up signal WUP in each case.

In the illustrated exemplary embodiment, input circuit 14 specifies a first criterion for evaluating an amplitude of applied wake-up signal WUP via an adjustable division ratio of a potential divider ST. In addition, input circuit 14 specifies an input impedance of evaluation circuit 10 via the appropriate dimensioning of the individual ohmic resistors R1 and R2 of potential divider ST. Switchable constant voltage source 16 specifies a second criterion for evaluating a time period of applied wake-up signal WUP via an adjustable time constant of an RC circuit RL, C1, C2.

As is further shown in FIGS. 1 and 2, applied wake-up signal WUP activates constant voltage source 16 via an ohmic resistor RB, which is connected to a base of a switching transistor T1 in the illustrated exemplary embodiment.

In the illustrated exemplary embodiment, comparator 12 is developed as a two-channel, integrated comparator circuit 12A, which includes a not further denoted internal voltage source and whose outputs Out_A and Out_B are developed as what is known as open collector outputs. The internal voltage source generates a reference voltage of 400 mV, for instance. In the process, a first voltage signal, which is applied at input In_A of the first channel of the multi-channel integrated comparator circuit 12A and represents the amplitude of the applied wake-up signal WUP, is compared to the reference voltage, the first criterion being satisfied if the first voltage signal is greater than the reference voltage. In addition, a second voltage signal, which is applied at the input In_B of the second channel of multi-channel, integrated comparator circuit 12A and represents the time period of the applied wake-up signal WUP, is compared to the reference voltage, a time criterion as the second criterion being satisfied if the second voltage signal is greater than the reference voltage.

As is further shown in FIG. 2, applied wake-up signal WUP is first down-divided by potential divider ST of input circuit 14 and rid of rapid transient disturbance signals through the use of a filter capacitor CF. Via the division ratio of potential divider ST of input circuit 14, an amplitude detection threshold is set as a first criterion for evaluating wake-up signal WUP and is easily able to be adapted to corresponding customer specifications by modifying the values of the two ohmic resistors R1, R2. Through the suitable selection of the internal resistance of the input circuit together with the capacitance value of filter capacitor CF, transient disturbances, which hinder a stable amplitude detection, are able to be removed. Down-divided wake-up signal WUP is connected to a non-inverting input In_A of the first channel. The internal voltage source is connected to an inverting input of the first channel which is not accessible from the outside. If down-divided wake-up signal WUP or the first voltage signal at non-inverting input In_A of the first channel of two-channel, integrated comparator circuit 12A exceeds the internal reference voltage of 400 mV, then a specified amplitude criterion of wake-up signal WUP is satisfied and an output Out_A of the first channel of two-channel, integrated comparator circuit 12A changes its state from active "low" to "high impedance". This causes capacitors C1 and C2 of the RC circuit, which are connected to output Out_A of the first channel via an ohmic protective resistor RS, to be charged via a charge resistor RL of the RC circuit.

As shown in FIG. 2, the RC circuit in the illustrated exemplary embodiment includes two capacitors C1 and C2 which are connected in parallel. The voltage across capacitors C1 and C2 is simultaneously applied as the second voltage signal at an inverting input In_B of the second channel of two-channel, integrated comparator circuit 12A. The internal voltage source is connected to a non-inverting input of the second channel which is not accessible from the outside. If the second voltage signal reaches the internal reference voltage of 400 mV, then the time criterion is satisfied in addition to the amplitude criterion, and output Out_B of the second channel of the two-channel, integrated comparator circuit 12A changes its state from "high impedance" to active "low". Since an open collector output is used in this instance as well, output driver circuit 5 pulls a connection pin of output Out_B of the second channel to mass potential. If wake-up signal WUP is no longer applied at evaluation circuit 10 or if the amplitude criterion is no longer satisfied, output Out_A of the first channel of two-channel, integrated comparator circuit 12A changes its state from "high impedance" to active "low" so that the two capacitors C1 and C2 are rapidly able to be discharged via protective resistor RS and its output Out_A. This behavior prevents the possible "summing" of the charges in the two capacitors C1 and C2 in the presence of multiple, consecutive wake-up signals that are separated from one another by only brief pauses. The time criterion is easily able to be adapted to corresponding customer specifications by changing the time constant via the values of the two capacitors C1 and C2 and charge resistor RL.

As is further shown in FIG. 2, the charging voltage of capacitors C1 and C2 is stabilized by a Zener diode Z1 and an ohmic resistor R5 to 2.7 V, for instance. Alternatively, some other voltage stabilization is able to be used in constant voltage source 16 for charging capacitors C1 and C2. For example, an adjusted band-gap voltage reference may be used in place of Zener diode Z1 if a higher accuracy of the time criterion is required. In order to prevent a permanent current consumption of constant voltage source 16, it is connected via switching transistor T1 only if a wake-up signal WUP is actually applied at the input of evaluation circuit 10. This makes it possible to reduce the no-load current consumption of evaluation circuit 10 to a few microampere. The energy for charging capacitors C1 and C2 is withdrawn from a reverse-polarity-protected permanent supply VZP of a not depicted vehicle battery only if a wake-up signal WUP is applied. This allows wake-up signal WUP to be largely decoupled and in this way enables a constant and supply-independent impedance of the input of evaluation circuit 10.

If both the amplitude criterion and the time criterion are satisfied, then processed wake-up signal WUPA is brought to approximately the potential of a supply voltage VDD at the output of output driver circuit 5 via a driver transistor T2 and an ohmic resistor R8. Driver transistor T2 is actuated by the active "low" state of output Out_B of the second channel of the two-channel, integrated comparator circuit 12A, a working point of driver transistor T2 being adjustable via a base potential divider made up of two ohmic resistors R6 and R7.

For the optimal supply of the two-channel, integrated comparator circuit 12A, a connection of a supply connection VDD of comparator circuit 12A takes place via a protective circuit 3, which restricts supply voltage VDD of two-channel, integrated comparator circuit 12A and of output driver circuit 5. In the illustrated exemplary embodiment, protective circuit 3 includes two ohmic resistors R3 and R4 which are connected in series, and a further Zener diode Z2, which clamps off supply voltage VDD from the reverse-polarity-protected permanent supply VZP of the vehicle. In the usual voltage range for a parked car (engine off) of permanent supply VZP in the range of 5V to 13.8 V, protective circuit 3 shunts virtually no current to frame, which means that this circuit component also has no effect on the sleep current demands for reverse-polarity-protected permanent supply VZP of the vehicle. A downstream low-pass filter TP, which includes an ohmic resistor RT and a capacitor CT, additionally filters supply voltage VDD of two-channel, integrated comparator circuit 12A using an adjustable cutoff frequency of 600 Hz, for example, in order to keep disturbances away from two-channel, integrated comparator circuit 12A and to optimize the quality of the wake-up signal discrimination according to amplitude and time in this way.

What is claimed is:

1. A circuit for processing a wake-up signal, which is usable for activation of an electrical device, comprising:
an evaluation circuit configured to evaluate an applied wake-up signal for validity; and
an output driver circuit configured to output a processed wake-up signal when the evaluation circuit evaluates the applied wake-up signal as valid;
wherein the evaluation circuit includes a comparator configured to compare the applied wake-up signal to at least one threshold value for the evaluation, an input circuit, and a switchable constant voltage source via which at least one criterion for evaluating the applied wake-up signal is adjustable in each case, the comparator being a multi-channel, integrated comparator circuit, and individual channels of the integrated comparator circuit evaluating one criterion of the applied wake-up signal in each case.

2. The circuit as recited in claim 1, wherein the input circuit specifies a first criterion for evaluating an amplitude of the applied wake-up signal via an adjustable division ratio of a potential divider.

3. The circuit as recited in claim 1, wherein the input circuit specifies an input impedance of the evaluation circuit.

4. The circuit as recited in claim 1, wherein the switchable constant voltage source specifies a second criterion for evaluating a time period of the applied wake-up signal via an adjustable time constant of an RC circuit.

5. The circuit as recited in claim 4, wherein the applied wake-up signal activates the constant voltage source.

6. The circuit as recited in claim 2, wherein the multi-channel, integrated comparator circuit includes an internal voltage source, which generates a reference voltage.

7. The circuit as recited in claim 6, wherein the multi-channel, integrated comparator circuit is configured to compare a first voltage signal, which is applied at the input of a first channel of the multi-channel, integrated comparator circuit and represents an amplitude of the applied wake-up signal, to the reference voltage, the first criterion being satisfied when the first voltage signal is greater than the reference voltage.

8. The circuit as recited in claim 7, wherein the multi-channel, integrated comparator circuit is configured to compare a second voltage signal, which is applied at the input of a second channel of the multi-channel, integrated comparator circuit and represents a time period of the applied wake-up signal, to the reference voltage, the second criterion being satisfied when the second voltage signal is greater than the reference voltage.

9. The circuit as recited in claim 8, wherein the multi-channel, integrated comparator circuit is configured to change a state at an output of the first channel when the first criterion is satisfied, the state change at the output of the first channel starting the evaluation of the second criterion.

10. The circuit as recited in claim 8, wherein the multi-channel, integrated comparator circuit is configured to change a state at an output of the second channel when the second criterion is satisfied, the state change at the output of the second channel activating the output driver circuit.

\* \* \* \* \*